(12) United States Patent
Kondo

(10) Patent No.: US 7,221,032 B2
(45) Date of Patent: May 22, 2007

(54) SEMICONDUCTOR DEVICE INCLUDING FINFET HAVING VERTICAL DOUBLE GATE STRUCTURE AND METHOD OF FABRICATING THE SAME

(75) Inventor: Masaki Kondo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/050,437

(22) Filed: Feb. 4, 2005

(65) Prior Publication Data

US 2006/0011977 A1  Jan. 19, 2006

(30) Foreign Application Priority Data

Jul. 2, 2004  (JP) .............................. 2004-196972

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ............... 257/401; 257/331; 257/347; 257/348; 257/349; 257/350; 257/351; 257/352; 257/353; 257/354

(58) Field of Classification Search ........ 257/347–354, 257/401, 331
See application file for complete search history.

(56) References Cited

U.S. PATENT DOCUMENTS

| | | | |
|---|---|---|---|
| 5,115,289 A | 5/1992 | Hisamoto et al. | |
| 6,413,802 B1 * | 7/2002 | Hu et al. ................... 438/151 |
| 6,518,105 B1 | 2/2003 | Yang et al. | |
| 6,888,181 B1 * | 5/2005 | Liao et al. .................. 257/192 |
| 6,970,373 B2 * | 11/2005 | Datta et al. ................. 365/154 |
| 2004/0110331 A1 * | 6/2004 | Yeo et al. ................... 438/199 |
| 2004/0217420 A1 * | 11/2004 | Yeo et al. ................... 257/347 |
| 2004/0266083 A1 * | 12/2004 | Hareland et al. ........... 438/199 |
| 2005/0062088 A1 * | 3/2005 | Houston ..................... 257/296 |
| 2005/0116218 A1 * | 6/2005 | Yang .......................... 257/19 |
| 2005/0145941 A1 * | 7/2005 | Bedell et al. ............... 257/348 |
| 2005/0148137 A1 * | 7/2005 | Brask et al. ................ 438/216 |
| 2005/0184316 A1 * | 8/2005 | Kim et al. ................... 257/213 |
| 2005/0242406 A1 * | 11/2005 | Hareland et al. ........... 257/401 |
| 2005/0245009 A1 * | 11/2005 | Bryant et al. ............... 438/151 |
| 2006/0001109 A1 * | 1/2006 | Shaheen et al. ............ 257/401 |
| 2006/0057787 A1 * | 3/2006 | Doris et al. ................. 438/153 |
| 2006/0068531 A1 * | 3/2006 | Breitwisch et al. ......... 438/149 |
| 2006/0234438 A1 * | 10/2006 | Yang et al. ................. 438/233 |

FOREIGN PATENT DOCUMENTS

JP  6-302819 A  10/1994

* cited by examiner

*Primary Examiner*—Ida M. Soward
(74) *Attorney, Agent, or Firm*—Foley & Lardner LLP

(57) ABSTRACT

A semiconductor device includes a semiconductor layer formed on a semiconductor substrate via an insulating film and having a projecting shape, a gate electrode formed, via a gate insulating film, on a pair of side surfaces of four side surfaces of the semiconductor layer and a source region and drain region formed on two side surfaces, on which the gate electrode is not formed, of the four side surfaces of the semiconductor layer. A portion of a channel region formed in the semiconductor layer is electrically connected to the gate electrode.

8 Claims, 6 Drawing Sheets

US 7,221,032 B2

SEMICONDUCTOR DEVICE INCLUDING FINFET HAVING VERTICAL DOUBLE GATE STRUCTURE AND METHOD OF FABRICATING THE SAME

CROSS REFERENCE TO RELATED APPLICATION

This application is based upon and claims benefit of priority under 35 USC §119 from the Japanese Patent Application No. 2004-196972, filed on Jul. 2, 2004, the entire contents of which are incorporated herein by reference.

BACKGROUND OF THE INVENTION

The present invention relates to a semiconductor device and a method of fabricating the same.

The development of semiconductor integrated circuits largely depends upon an excellent property, i.e., the scaling law (the standard of micropatterning) of a MOSFET (Metal Oxide Semiconductor Field Effect Transistor) as a constituent element. That is, in a semiconductor integrated circuit, the number of MOSFETS integrated in a limited chip area can be increased by reducing the dimensions of these MOSFETs on the basis of this scaling law.

If micropatterning progresses in a conventional planar type MOSFET, however, the standby power (the power consumption in a standby state) abruptly increases, and this limits the progress of micropatterning.

In this planar type MOSFET, when dimensions are reduced on the basis of the scaling law, the impurity concentration in a channel region must be increased accordingly. If the impurity concentration in the channel region of the planar type MOSFET increases, however, the capacitive coupling between the channel region and a semiconductor substrate increases. This reduces the inversion charge amount, and lowers the drivability.

In the planar type MOSFET, therefore, a gate threshold voltage must be lowered to maintain given drivability. However, if this gate threshold voltage is lowered, a cutoff current (OFF current) exponentially increases.

Also, in the planar type MOSFET, if the impurity concentration in the channel region increases, a junction leakage current or surface leakage current increases. This further increases the standby power.

For example, when the gate length is 50 [nm], the standby power may exceed the active power (the power consumption during operation). In this case, even if micropatterning is performed to avoid the problem of heat generation, it is impossible to integrate a large number of planar type MOSFETs on a chip, so the integration degree cannot be increased.

To suppress this increase in standby power, a MOSFET (to be referred to as a FinFET hereinafter) having a vertical double gate structure is developed as a new transistor structure which replaces the planar type MOSFET.

In this FinFET, a semiconductor layer having the shape of a fin, i.e., a projecting shape is formed on a semiconductor substrate, and an inverted U-shaped gate electrode is formed on two side surfaces and the upper surface of the semiconductor layer via an insulating film so as to cross the semiconductor layer. Also, in the FinFET, a source region and drain region are formed on a pair of opposing side surfaces, on which the gate electrode is not formed, of the four side surfaces of the semiconductor layer.

In this FinFET, the gate electrode is formed on the two side surfaces of the semiconductor layer. Therefore, if the width of this semiconductor layer (i.e., the spacing between the legs of the gate electrode) is sufficiently small, the charge amount in a channel region formed in the semiconductor layer strongly depends upon the gate electric field formed by the gate electrode. Therefore, the FinFET does not easily suffer the influence of the capacitive coupling between the channel region and semiconductor substrate. As a consequence, the inversion charge amount does not depend upon the impurity concentration in the channel region any longer.

Also, in the FinFET, the charge amount in the channel region strongly depends on the gate electric field. Therefore, the FinFET does not easily suffer the influence of the capacitive coupling between the channel region and drain region. This suppresses the short channel effect. In the FinFET, therefore, the increase in standby power caused by micropatterning can be minimized.

To actually suppress the short channel effect in the FinFET, the width of the semiconductor layer must be decreased to at least half the gate length (the spacing between the source region and drain region). Since, however, such a FinFET is difficult to fabricate, a method of suppressing the short channel effect more efficiently is being sought.

Similar to a planar type MOSFET using an SOI (Silicon On Insulator) substrate, a FinFET using an SOI substrate has a majority carrier storage effect (body floating effect) and self-heating effect. This fluctuates the threshold voltage or lowers the drivability (described in, e.g., the following patent reference).

Patent reference: Japanese Patent Laid-Open No. 6-302819

SUMMARY OF THE INVENTION

According to one aspect of the present invention, there is provided a semiconductor device comprising:

a semiconductor layer formed on a semiconductor substrate via an insulating film and having a projecting shape;

a gate electrode formed, via a gate insulating film, on a pair of side surfaces of four side surfaces of said semiconductor layer; and a source region and drain region formed on two side surfaces, on which said gate electrode is not formed, of the four side surfaces of said semiconductor layer, wherein a portion of a channel region formed in said semiconductor layer is electrically connected to said gate electrode.

According to one aspect of the present invention, there is provided a semiconductor device fabrication method, comprising:

depositing a semiconductor layer and mask material in order on a semiconductor substrate via a buried insulating film;

forming a semiconductor layer having a projecting shape by patterning the semiconductor layer and mask material;

forming a gate insulating film on a pair of opposing side surfaces of four side surfaces of the semiconductor layer;

depositing a gate electrode material on the buried insulating film, gate insulating film, and mask material;

etching the gate electrode material and gate insulating film to a position lower than an upper end of the semiconductor layer by using the mask material as a mask, thereby exposing corners at the upper end of the semiconductor layer;

depositing the gate electrode material again, and patterning the gate electrode material and gate insulating film, thereby forming a gate electrode, via the gate insulating film, on the pair of opposing side surfaces of the four side surfaces of the semiconductor layer; and ion-implanting a predetermined impurity into the semiconductor layer by using the gate electrode as a mask, thereby forming a source region and drain region on two side surfaces, on which the gate electrode is not formed, of the four side surfaces of the semiconductor layer.

DETAILED DESCRIPTION OF THE EMBODIMENTS

An embodiment of the present invention will be described below with reference to the accompanying drawings.

Figure 1:
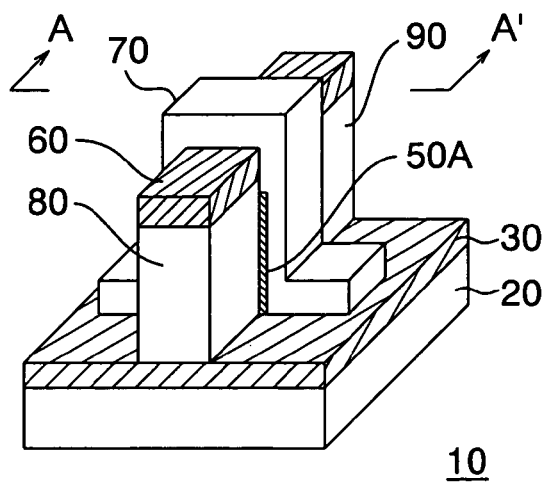
FIG. 1 is a perspective view showing the arrangement of a FinFET according to an embodiment of the present invention.
Figure 2:
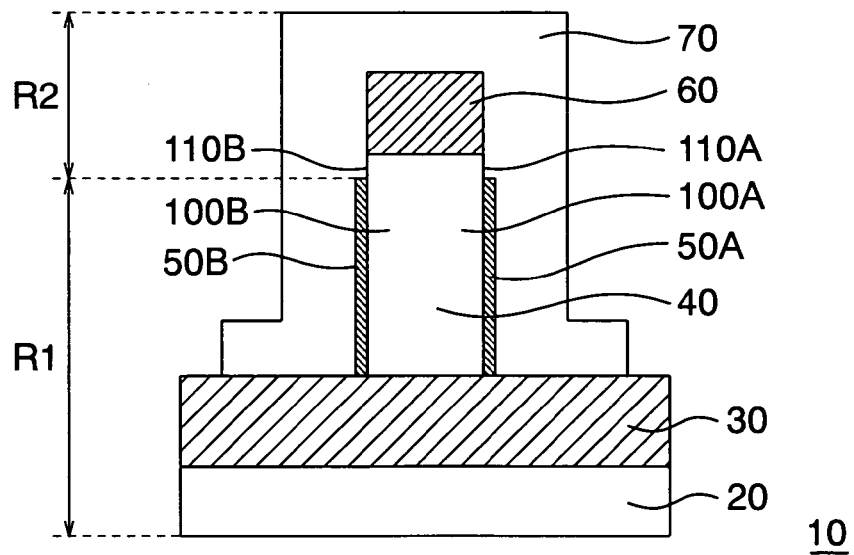
FIG. 2 is a longitudinal sectional view taken along a line A–A' of the same FinFET.

FIG. 1 shows the arrangement of a FinFET 10 according to the embodiment of the present invention. FIG. 2 is a longitudinal sectional view taken along a line A–A' of the FinFET shown in FIG. 1.

In the FinFET 10, a buried insulating film 30 is formed on the surface of a semiconductor substrate 20. On the buried insulating film 30, a projecting semiconductor layer 40 having a fin shape, i.e., a projecting shape is formed.

Gate insulating films 50A and 50B are formed on two side surfaces of the projecting semiconductor layer 40. A pad nitride 60 made of a silicon nitride film ($Si_3N_4$ film) is formed on the upper surface of the projecting semiconductor layer 40.

An inverted U-shaped gate electrode 70 is formed on the two side surfaces and upper surface of the projecting semiconductor layer 40 via the gate insulating films 50A and 50B and pad nitride 60, so as to cross the projecting semiconductor layer 40. The gate electrode 70 is made of, e.g., polysilicon to which an impurity having the same conductivity type as a channel region is added, or a metal by which the surface of contact with the channel region forms an ohmic junction.

In the FinFET 10, of the four side surfaces of the projecting semiconductor layer 40, a source region 80 and drain region 90 opposing each other are formed on two side surfaces on which the gate electrode 70 is not formed.

In addition, in the FinFET 10, corners 110A and 110B at the upper ends (on the side of the pad nitride 60) of channel regions 100A and 100B formed in the projecting semiconductor layer 40 during operation are formed in contact with the gate electrode 70. As a consequence, the corners 110A and 110B at the upper ends of the channel regions 100A and 100B formed in the projecting semiconductor layer 40 are electrically connected to the gate electrode 70.

Figure 3:
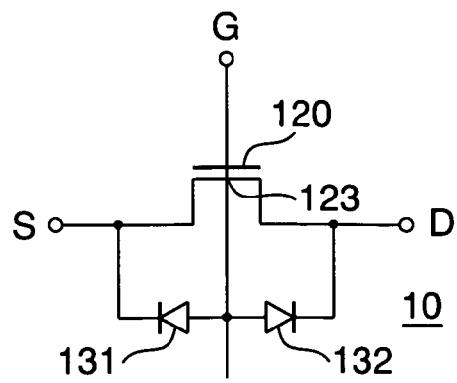
FIG. 3 is a circuit diagram showing the configuration of the same FinFET.

In the FinFET 10, therefore, a circuit portion in a region R1 shown in FIG. 2 operates as a normal MOSFET, and a circuit portion in a region R2 operates as a diode. That is, as shown in FIG. 3, the FinFET 10 has a circuit configuration obtained by connecting a MOSFET 120, a diode 131 having an anode connected to a gate G and channel 123 of the MOSFET 120 and a cathode connected to a source S of the MOSFET 120, and a diode 132 having an anode connected to the gate G and channel 123 of the MOSFET 120 and a cathode connected to a drain D of the MOSFET 120.

The diodes 131 and 132 are OFF until the gate voltage becomes about 1 V, and an electric current flowing from the gate G to the source S and drain D is sufficiently small. On the other hand, the corners 110A and 110B at the upper ends of the channel regions 100A and 100B discharge majority carriers stored in the channel regions 100A and 100B to the gate electrode 70.

Figure 4:
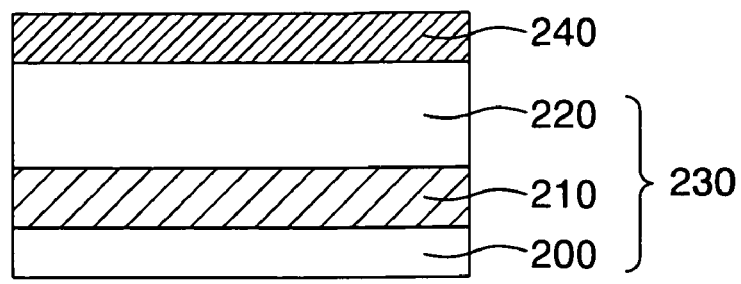
FIG. 4 is a longitudinal sectional view showing the sectional structure of an element in one step of a method of fabricating the FinFET according to the embodiment.

A method of fabricating the FinFET 10 according to this embodiment will be described below with reference to FIGS. 4 to 9. First, as shown in FIG. 4, an SOI substrate 230 is prepared by stacking a buried insulating film 210 and an SOI layer 220 made of silicon single crystal in this order on a semiconductor substrate 200. A pad nitride 240 made of a silicon nitride film ($Si_3N_4$ film) having a small thickness, e.g., 100 [nm] is deposited on the SOI substrate 230 by CVD (Chemical Vapor Deposition) or the like.

Figure 5:
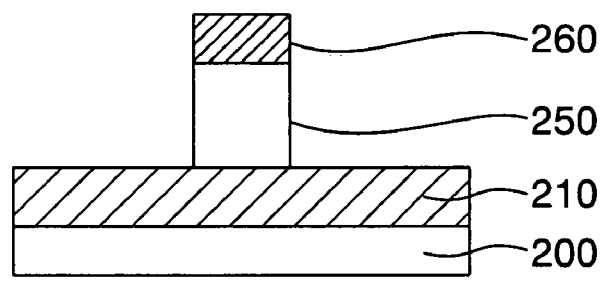
FIG. 5 is a longitudinal sectional view showing the sectional structure of the element in another step of the method of fabricating the same FinFET.

As shown in FIG. 5, the pad nitride 240 and SOI layer 220 are patterned in this order to form a pad nitride 260 and projecting semiconductor layer 250.

Figure 6:
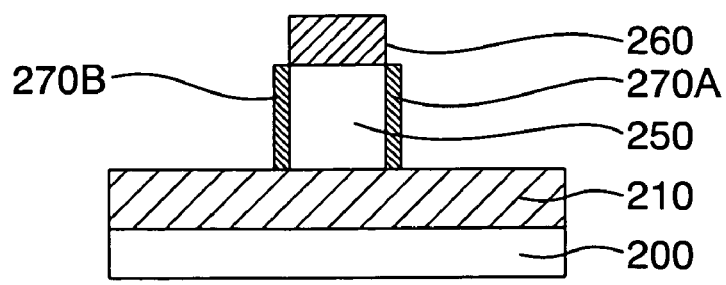
FIG. 6 is a longitudinal sectional view showing the sectional structure of the element in another step of the method of fabricating the same FinFET.
Figure 7:
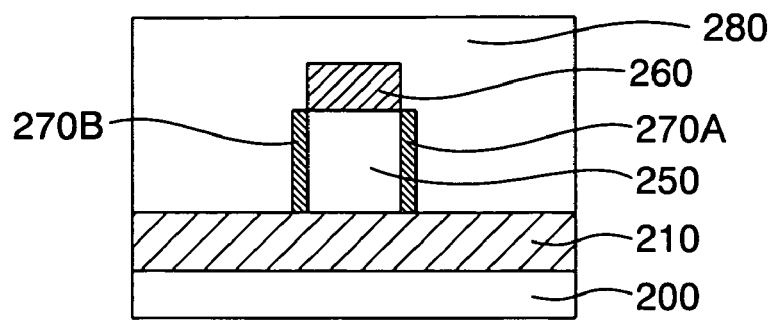
FIG. 7 is a longitudinal sectional view showing the sectional structure of the element in another step of the method of fabricating the same FinFET.

As shown in FIG. 6, thermal oxidation is used to form gate insulating films 270A and 270B made of silicon oxide films on a pair of opposing side surfaces of the four side surfaces of the projecting semiconductor layer 250. As shown in FIG. 7, a gate electrode material 280 such as polysilicon is deposited by CVD or the like.

Figure 8:
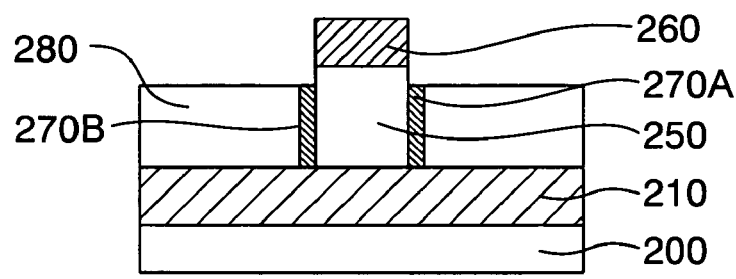
FIG. 8 is a longitudinal sectional view showing the sectional structure of the element in another step of the method of fabricating the same FinFET.

As shown in FIG. 8, predetermined etching conditions are selected, and the pad nitride 260 is used as a mask to etch the gate electrode material 280 to a position lower than the upper end of the projecting semiconductor layer 250. That is, overetching which etches the gate electrode material 280 by a thickness larger than the film thickness of the pad nitride 260 is performed, thereby etching the upper portions of the gate insulating films 270A and 270B, and exposing the corners at the upper end of the projecting semiconductor layer 250.

Figure 9:
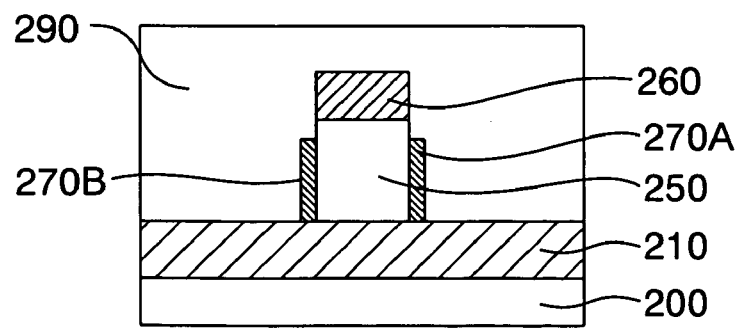
FIG. 9 is a longitudinal sectional view showing the sectional structure of the element in another step of the method of fabricating the same FinFET.
Figure 10:
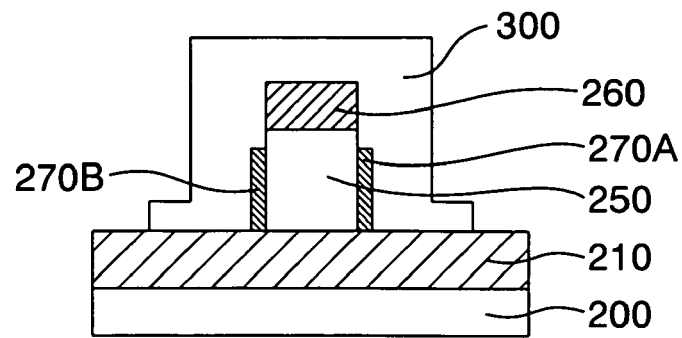
FIG. 10 is a longitudinal sectional view showing the sectional structure of the element in another step of the method of fabricating the same FinFET.
Figure 11:
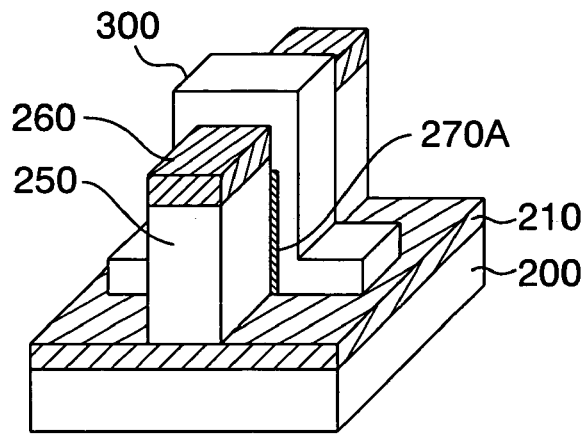
FIG. 11 is a longitudinal sectional view showing the sectional structure of the element in another step of the method of fabricating the same FinFET.
Figure 12:
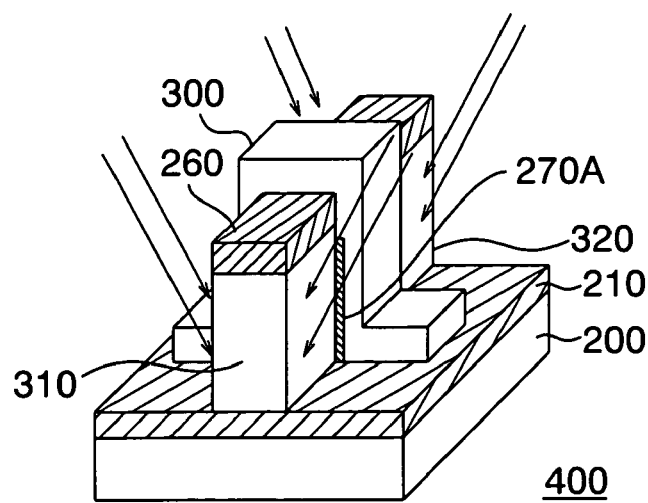
FIG. 12 is a longitudinal sectional view showing the sectional structure of the element in another step of the method of fabricating the same FinFET.

As shown in FIG. 9, a gate electrode material 290 is deposited again by CVD or the like. As shown in FIG. 10 and FIG. 11 which is a perspective view of FIG. 10, a gate electrode 300 is formed by patterning the gate electrode material 290. As shown in FIG. 12, the gate electrode 300 is used as a mask to perform ion implantation into the projecting semiconductor layer 250 obliquely to the semiconductor substrate 200, thereby forming a source region 310 and drain region 320. In this manner, a FinFET 400 is formed.

Figure 13:
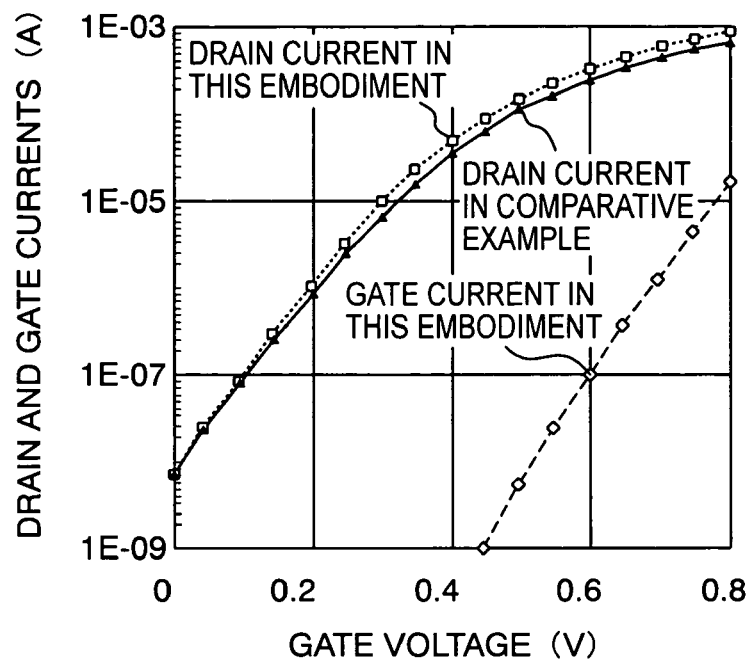
FIG. 13 is a graph showing the results of comparison of the current-voltage characteristics of the FinFET according to the embodiment and a FinFET of a comparative example.
Figure 14:
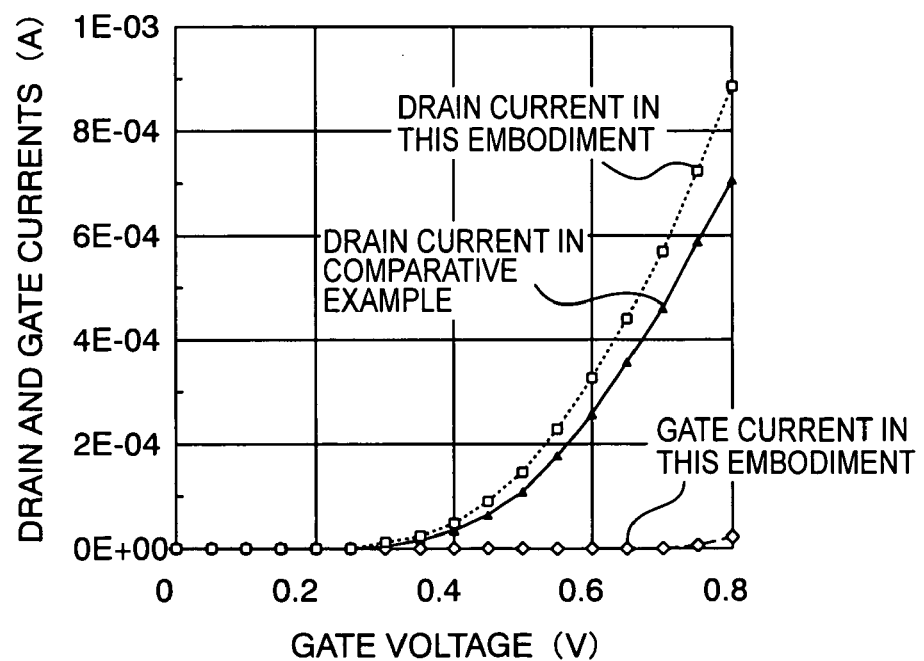
FIG. 14 is a graph showing the results of comparison of the current-voltage characteristics of the same FinFET and the FinFET of the comparative example.
Figure 15:
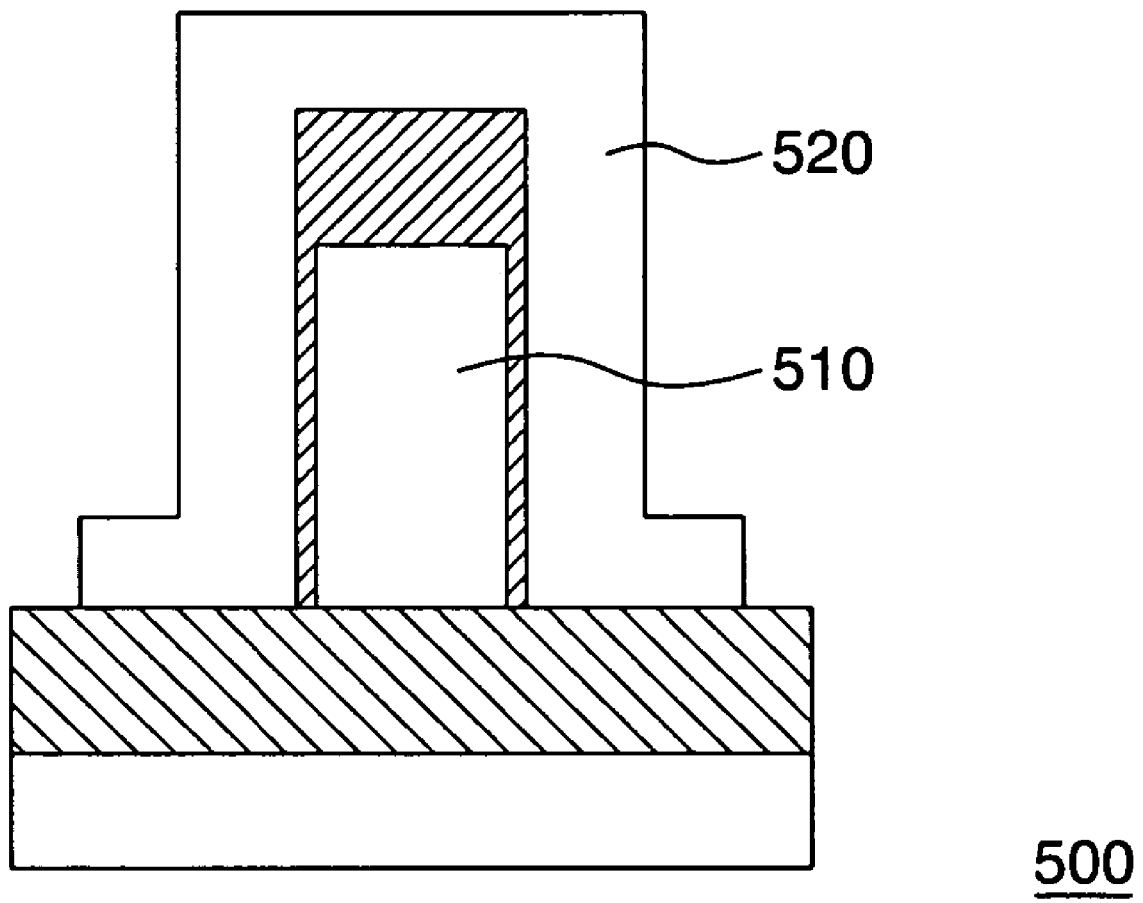
FIG. 15 is a longitudinal sectional view showing the arrangement of the FinFET of the comparative example.

FIGS. 13 and 14 illustrate the results of comparison, by simulation, of the current-voltage characteristics of the Fin-FET 10 according to this embodiment and a FinFET 500 of a comparative example shown in FIG. 15. The FinFET 500 has a structure in which a projecting semiconductor layer 510 is not in contact with a gate electrode 520. In the FinFET 10 according to this embodiment and the FinFET of the comparative example, the gate length is 50 [nm], the width of the projecting semiconductor layer is 25 [nm], and the ambient temperature is 85° C. Referring to FIGS. 13 and 14, the ordinate indicating a drain current and gate current is represented by a log scale in FIG. 13, and by a linear scale in FIG. 14.

As shown in FIGS. 13 and 14, when the gate voltage is 0.2 [V], the slope of the drain current of the FinFET 10 according to this embodiment is larger than that of the drain current of the FinFET of the comparative example. This is owing to the ability of the FinFET 10 to suppress the short channel effect. Therefore, the ability makes it possible to reduce the manufacturing cost of the FinFET. Also, the drain current of the FinFET 10 according to this embodiment is larger than that of the FinFET of the comparative example. Accordingly, the drivability of the FinFET 10 is higher than that of the FinFET of the comparative example.

In the FinFET 10 according to this embodiment, the channel regions 100A and 100B are in contact with the gate electrode 70, so a gate current flows. However, in the FinFET 10 according to this embodiment as shown in FIG. 14, this gate current is negligibly small compared to the drain current. Therefore, even when the gate current flows, it does not increase the standby power.

Furthermore, in the FinFET 10 according to this embodiment, the channel regions 100A and 100B are in contact with the gate electrode 70. Therefore, majority carriers and heat generated and stored when an electric current flows through the channel regions 100A and 100B can be rapidly discharged to the gate electrode 70 outside the channel regions 100A and 100B. This makes it possible to prevent the fluctuations in threshold voltage and the decrease in drivability.

In the FinFET 10 according to this embodiment, the corners 110A and 110B at the upper ends of the channel regions 100A and 100B in the projecting semiconductor layer 40 are formed in contact with the gate electrode 70. This suppresses the increase in standby power. In addition, compared to a FinFET having a structure in which the channel regions in the projecting semiconductor layer are not in contact with the gate electrode, the width of the projecting semiconductor layer 40 need not be decreased to half the gate length or less. This makes it possible to suppress the short channel effect more efficiently, and prevent the majority carrier storage effect and self-heating effect.

The semiconductor device and the method of fabricating the same the above embodiment can suppress the short channel effect more efficiently while suppressing the increase in power consumption.

In the above embodiment, the inverted U-shaped gate electrode 70 is formed on the side surfaces and upper surface of the projecting semiconductor layer 40 so as to cross the projecting semiconductor layer 40. However, the present invention is not limited to this embodiment, and it is also possible to form a gate electrode not on the upper surface but only on the side surfaces of the projecting semiconductor layer 40.

Furthermore, the above embodiment is merely an example, and hence does not limit the present invention. For example, the corners 110A and 110B at the upper ends of the channel regions 100A and 100B formed in the projecting semiconductor layer 40 need not be electrically connected to the gate electrode 70. That is, portions of the channel regions 100A and 100B in the projecting semiconductor layer 40 need only be electrically connected to the gate electrode 70.

What is claimed is:

1. A semiconductor device comprising:
    a semiconductor layer formed on a semiconductor substrate via an insulating film and having a projecting shape;
    a gate electrode formed, via a gate insulating film, on a pair of side surfaces of four side surfaces of said semiconductor layer; and
    a source region and drain region formed on two side surfaces, on which said gate electrode is not formed, of the four side surfaces of said semiconductor layer,
    wherein a portion of a channel region formed in said semiconductor layer is electrically connected to said gate electrode.

2. A device according to claim 1, wherein the semiconductor device is formed using an SOI substrate.

3. A device according to claim 1, wherein the semiconductor device has a FinFET including said gate electrode, source region, drain region, and channel region.

4. A device according to claim 1, wherein corners at an upper end of said channel region formed in said semiconductor layer are in contact with said gate electrode.

5. A device according to claim 4, further comprising a mask material formed on upper surfaces of said semiconductor layer and source and drain regions, and having a desired film thickness.

6. A device according to claim 5, wherein said gate electrode is formed on the side surfaces and upper surface of said semiconductor layer via said gate insulating film and mask material, and has an inverted U-shape so as to cross said semiconductor layer.

7. A device according to claim 1, further comprising a mask material formed on upper surfaces of said semiconductor layer and source and drain regions, and having a desired film thickness.

8. A device according to claim 7, wherein said gate electrode is formed on the side surfaces and upper surface of said semiconductor layer via said gate insulating film and mask material, and has an inverted U-shape so as to cross said semiconductor layer.

* * * * *